United States Patent
Tomiuchi et al.

(10) Patent No.: US 6,358,652 B1
(45) Date of Patent: Mar. 19, 2002

(54) FLUORESCENT CONVERSION FILTER AND ORGANIC LIGHT-EMITTING DEVICE EQUIPPED WITH THE FLUORESCENT CONVERSION FILTER

(75) Inventors: Yoshimasa Tomiuchi; Ryoji Kobayashi; Yotaro Shiraishi, all of Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/621,162

(22) Filed: Jul. 21, 2000

(30) Foreign Application Priority Data

Jul. 22, 1999 (JP) ............................................. 11-207678

(51) Int. Cl.[7] .......................... H05B 33/14; C09K 11/06
(52) U.S. Cl. .......................................... 430/7; 313/504
(58) Field of Search ................................ 430/7; 313/504

(56) References Cited

U.S. PATENT DOCUMENTS

| | | | |
|---|---|---|---|
| 5,792,589 A | 8/1998 | Udagawa et al. | 430/270.1 |
| 6,249,372 B1 * | 6/2001 | Kobayashi et al. | 359/326 |

FOREIGN PATENT DOCUMENTS

| | | |
|---|---|---|
| JP | 56125722 | 10/1981 |
| JP | 05173122 | 7/1993 |
| JP | 06273925 | 9/1994 |
| JP | 07152153 | 6/1995 |
| JP | 07325392 | 12/1995 |
| JP | 09106888 | 4/1997 |
| JP | 09115668 | 5/1997 |
| JP | 09115688 | 5/1997 |
| JP | 09061996 | 7/1997 |

\* cited by examiner

*Primary Examiner*—John A. McPherson
(74) *Attorney, Agent, or Firm*—Morrison Law Firm

(57) ABSTRACT

A fluorescent conversion filter suppresses decomposition and quenching of fluorescent dyes or pigments. An organic light-emitting device may be equipped with such a fluorescent conversion filter. The fluorescent conversion filter is formed by coating with a coating material, followed by patterning by photolithography. The coating material consists of a mixture of organic fluorescent dye or pigment that absorbs light in the ultraviolet to visible light region. The coating also includes a photo-setting or photo-and-thermo-setting resin containing a photopolymerizaion initiator of a hydrogen abstraction type having a benzophenone skeleton within the molecule. As a result, an organic light-emitting device is produced by combining the a fluorescent conversion filter with an organic light-emitting element.

15 Claims, 1 Drawing Sheet

FLUORESCENT CONVERSION FILTER AND ORGANIC LIGHT-EMITTING DEVICE EQUIPPED WITH THE FLUORESCENT CONVERSION FILTER

BACKGROUND OF THE INVENTION

The present invention relates to a fluorescent conversion filter that converts light, emitted by a light-emitting device, in near ultraviolet to visible region light to light in different visible region. The invention also relates to an organic light-emitting device equipped with a fluorescent conversion filter. The fluorescent conversion filter and the organic light-emitting device are applicable to both consumer and industry display apparatuses such as a self-emitting multi-colored or full colored-display, a display panel, and a backlight.

Increasing demand for flat panel displays to replace conventional cathode ray tube (CRT) displays, has promoted active development and practical application of various display devices. An electroluminescent device (hereinafter referred to as light-emitting device) is one of the devices created to meet the demand. The light-emitting device has received attention as an all solid state self light-emitting device. The light-emitting device exhibits high resolution and high visibility not readily attained by other display devices.

In a known method for multi-colored or full-colored displays, such as a flat panels, organic light-emitting elements corresponding to the three primary colors of red, blue and green are separately arranged in a matrix form and each of them is caused to emit light. This method is disclosed by Japanese Unexamined Patent Application Publication Nos. S57-157487, S58-147989 and H3-214593. However, the color display using an organic light-emitting device requires precise matrix arrangement of three kinds of light-emitting material for red, blue and green. The technology for this arrangement is difficult and costly to manufacture. Additionally, the chromaticity gradually deviates because the lifetime of the three light-emitting materials differs each other.

In another known method for color display, white light emitted from a backlight is passed through filters and three primary colors are obtained. This method is disclosed by Japanese Unexamined Patent Application Publication Nos. H1-315988, H2-273496 and H3-194895. However, to attain red, green and blue light of high brightness a white-light-emitting device requires high brightness. A white-light emitting device exhibiting both a long life and high brightness has not been obtained yet.

In another known method for color display, fluorescent elements separately arranged in a plane, absorb light from a light-emitting body and each of the fluorescent elements emits multi-colored fluorescent light. This method is disclosed by Japanese Unexamined Patent Application Publication No. H3-152897. This method uses a light-emitting body and fluorescent elements to create multi-colored fluorescent light. This method applied to CRT and plasma display.

In recent years, a color conversion method has been developed in which fluorescent material is used as a filter. The fluorescent material absorbs light from an organic light-emitting element and emits fluorescent light in a visible light region. This method is disclosed by Japanese Unexamined Patent Application Publication Nos. H3-152897 and H5-258860. In this method, the color of the light emitted from the organic light-emitting element is not limited to white light. This method allows use of a brighter organic light-emitting element as a light source. In an example of the color conversion method using an organic light-emitting element emitting blue light, wave length conversion is performed from blue light to green light or to red light. This example is disclosed by Japanese Unexamined Patent Application Publication Nos. H3-152897, H8-286033 and H9-208944.

Organic fluorescent dyes such as rhodamine dye, pyridine dye, oxadine dye and coumarin dye are used for the fluorescent material described above. This use is disclosed by Japanese Unexamined Patent Application Publication Nos. H8-78158, H8-222369, H8-279394, H8-286033, H9-106888, H9-208944, H9-245511, H9-330793 and H10-12379.

Where low energy rays, such as radiation in a near ultraviolet to visible light region, from an organic light-emitting element are used, a full-colored self-emitting display device could be constructed by precisely patterning a fluorescent conversion filter containing such organic fluorescent dye.

There are two methods, among the known methods, for patterning a fluorescent conversion filter. In the first method, similar to the case of inorganic fluorescent material, an organic fluorescent dye is dispersed in a liquid photoresist that is a photo-reactive polymer. The resulting material is then laminated by spin-coating, followed by patterning by means of photolithography. This method is disclosed by Japanese Unexamined Patent Application Publication Nos. H5-198921 and H5-258860.

In the second method, organic fluorescent dye or organic fluorescent pigment is dispersed in a basic binder. The resulting article is then etched by acidic aqueous solution. This method is disclosed by Japanese Unexamined Patent Application Publication No. H9-208944.

The first above-described method of patterning, by means of photolithography, raises a problem where organic fluorescent dye is dispersed in a liquid photoresist. Since the liquid photoresist contains a photopolymerizaion agent, an agent for thermosetting (or polymerization initiator), and a reactive multifunctional monomer or oligomer, decomposition and quenching of the organic dye often occur. Decomposition and quenching of the organic dye can occur due to radicals originated from the photopolymerization initiator or due to propagation radicals of the reactive multifunctional monomer.

The second above-described method of patterning, by means of an acidic aqueous solution, raises a problem when photoresist is coated on the fluorescent conversion filter comprised of a basic binder and later followed by patterning. Since manufacturing a filter requires many steps cost and time are increased. Additionally, as a further disadvantage, this method creates a narrowing of the pattern, caused by side etching.

OBJECTS AND SUMMARY OF THE INVENTION

It is an object of the invention to provide a fluorescent conversion filter that facilitates controlling the radicals originated from the photopolymerization initiator and the propagation radicals of reactive multifunctional monomer in the photolithography process. This will suppress decomposition and quenching of the fluorescent dye.

It is another object of the invention to provide an organic light-emitting device having such a fluorescent conversion filter.

An organic light-emitting device may be equipped with a fluorescent conversion filter which suppresses decomposition and quenching of fluorescent dyes or pigments. The fluorescent conversion filter is formed by coating with a coating material, followed by patterning by photolithography. The coating material consists of a mixture of organic fluorescent dye or pigment that absorbs light in the ultraviolet to visible light region. The coating also includes a photo-setting or photo-and-thermo-setting resin containing a photopolymerizaion initiator of a hydrogen abstraction type having a benzophenone skeleton within the molecule. As a result, an organic light-emitting device is produced by combining the a fluorescent conversion filter with an organic light-emitting element.

According to an embodiment of the invention, there is provided a fluorescent conversion filter comprising: an organic fluorescent dye or an organic fluorescent pigment that absorbs light in a near ultraviolet to visible light region emitted from a light-emitting element, the organic fluorescent dye or pigment emitting different visible light, a matrix resin bearing the organic fluorescent dye or pigment, the resin matrix being a photo-setting resin or a photo-and-thermo-setting resin containing a photopolymerization initiator, the photopolymerization initiator of a hydrogen abstract type, the photopolymerization initiatory having a benzophenone skeleton represented by the following general formula (I) or (II):

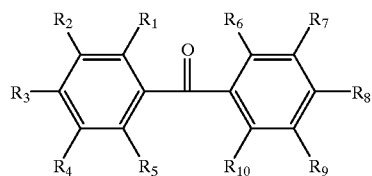

(I)

Wherein each of $R_1$ through $R_{10}$, independently represents a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, or an optionally substituted pyridyl group.

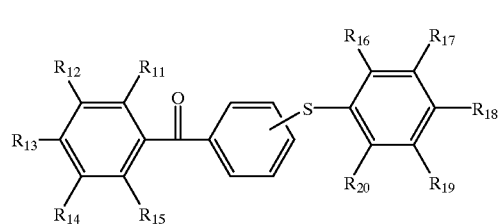

(II)

Wherein each of $R_{11}$ through $R_{20}$, independently represents a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, or an optionally substituted pyridyl group.

According to another embodiment of the invention there is provided an organic light-emitting device comprising: a fluorescent conversion filter and an organic light emitting element, the organic light emitting element containing an anode patterned on an insulative inorganic oxide film in the fluorescent conversion filter in a set of stripes, the anode composed of electrodes in a pattern, a cathode formed on an electron injection layer, the cathode composed of metal electrodes patterned on the electron injection layer in a set of stripes, the anode stripes disposed orthogonal to the cathode stripes, a hole injection layer covering the anode, a hole transport layer formed on the hole injection layer, an organic light emitting layer formed on the hole transport layer; and an electron injection layer formed on the organic light emitting layer.

The following describes how the fluorescent conversion filter of the invention works. Hardening reaction or polymerization of the photo-setting resin includes radical reaction and ionic reaction. Where the polymerization proceeds by radical reaction, a photopolymerization initiator is necessary, while a photo-sensitizer is sometimes added. There are three types of photopolymerization initiators:

(1) a photo-cleavage type, where a bond is cleaved by a photon to generate two radicals,
(2) a hydrogen abstraction type, where a hydrogen atom is abstracted from a molecule to convert the molecule to a radical, and
(3) an electron transfer type, where an electron(s) transfers between molecules to generate a radical ion.

Experiments determined that, in the action of the radicals to the organic fluorescent dyes, the photo-cleavage type radicals (1) and the electron transfer type radicals (3) interact with an excited dye and are very likely to quench fluorescence in the excited dye. The hydrogen abstraction type initiator (2) rarely affects the excited dye and is not likely to quench fluorescence in the dye.

The present invention has been accomplished based on the finding, and uses the photo-setting resin containing a photopolymerization initiator of a hydrogen abstraction type, having a benzophenone skeleton represented by the general formula (I) or (II) (shown above), as a matrix resin bearing the organic fluorescent dyes or pigments. The use of such photo-setting resin suppresses decomposition and quenching of the fluorescent dye in the photolithography process, to facilitate providing a fluorescent conversion filter with high precision and high conversion efficiency.

The present invention provides a fluorescent conversion filter which absorbs light in a near ultraviolet to visible light region from a light-emitting element and converts the light to a different visible light, for example, red light, with high efficiency. In addition, the fluorescent conversion filter of the invention allows highly precise patterning easily with low cost. An organic light-emitting device equipped with such a fluorescent conversion filter is applicable to commercial-oriented and industry-used display apparatuses, such as a self-lightening multicolored or full-colored display, a display panel, and a backlight. Moreover, a full-colored display device with organic light-emitting elements capable of low voltage driving can be manufactured by equipping such elements with the fluorescent conversion filter of the invention.

The above, and other objects, features and advantages of the present invention will become apparent from the following description read in conjunction with the accompanying drawings, in which like reference numerals designate the same elements.

DETAILED DESCRIPTION OF THE INVENTION

Figure 1:
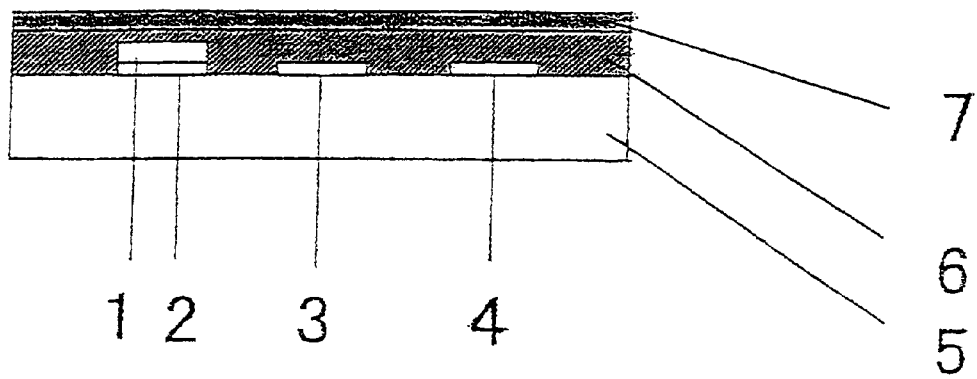
FIG. 1 is a schematic cross sectional view, illustrating an embodiment of the fluorescent conversion filter of the invention.
Figure 2:
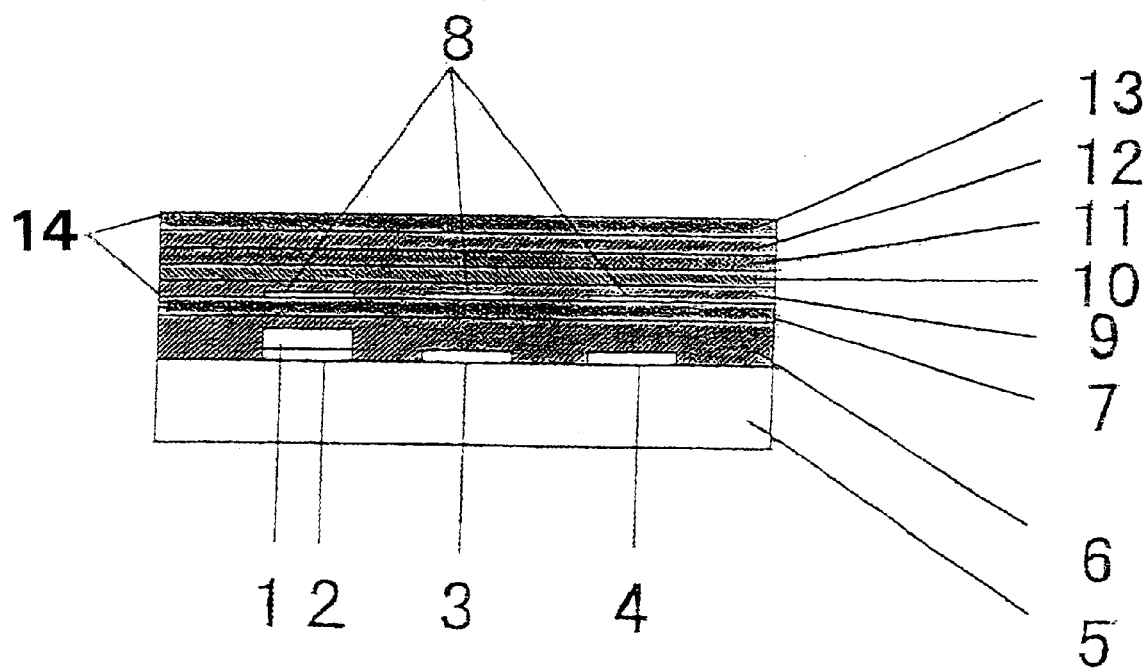
FIG. 2 is a schematic cross sectional view, illustrating an embodiment of an organic light-emitting device of the invention.

Referring to FIG. 2, an organic light-emitting device comprises a fluorescent conversion filter, as shown in FIG. 1, and an organic light-emitting element 14.

The fluorescent conversion filter absorbs light in a near ultraviolet to visible light region, preferably in a blue to blue-green region, emitted from the organic light-emitting element 14 and emits different visible light.

As shown in FIG. 1, the fluorescent conversion filter comprises a transparent substrate 5, a red filter layer 2 on transparent substrate 5, and a fluorescent conversion filter layer 1 on red filter layer 2. Red filter layer 2 and fluorescent conversion filter layer 1 are disposed in a predetermined plane pattern.

The fluorescent conversion filter layer 1 comprises one or more organic fluorescent dyes or pigments (hereinafter referred to simply as fluorescent dye or pigment) that emits fluorescent light in a red region, and a matrix resin. The matrix resin is obtained by hardening at least one of a photo-setting resin and a photo-and-thermo-setting resin containing one or more photopolymerization initiators, of a hydrogen abstraction type having a benzophenone skeleton represented by the general formula (I) or (II).

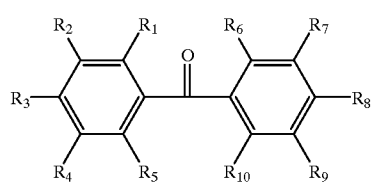

(I)

Where, each of $R_1$ through $R_{10}$, independently represents a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, or an optionally substituted pyridyl group.

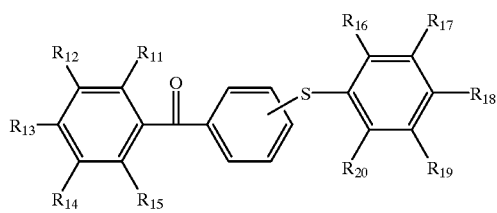

(II)

Where, each of $R_1$ through $R_{20}$ independently represents a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, and an optionally substituted pyridyl group.

Red filter layer 2 transmits red light converted by the fluorescent conversion filter layer 1 and substantially blocks light in other colors.

A green filter layer 3 and a blue filter layer 4 are also formed on transparent substrate 5 in each predetermined pattern. Green filter layer 3 transmits substantially only green light emitted from the organic light emitting element 14. Blue filter layer 4 transmits substantially only blue light emitted from the organic light emitting element 14.

A protective film 6 and an insulative inorganic oxide film 7 cover the filter layers and constitute a filter portion of an organic light-emitting device.

The fluorescent dye or pigment in the invention may be any material that absorbs light in near ultraviolet to visible light region, in particular blue to blue-green region, and emits different visible light. Preferably used is one or more fluorescent dyes or pigments that emits at least fluorescent light in red region. Combinations with one or more fluorescent dyes or pigments may be applied.

Organic light-emitting element 14, (hereinafter referred to as light emitting element), emits blue to blue-green light of adequate intensity for use with blue and substantially with green filters, but is generally unable to emit sufficient red light for use with red filters.

Light in the blue region, of adequate intensity, may be obtained by transmitting the light from organic light-emitting element 14 through blue filter layer 4.

Light in the green region, of more limited intensity, may be obtained by alternatively transmitting light from organic light-emitting element 14 through green filter layer 3 or by conversion to light in the green region by means of fluorescent dye or pigment.

Light in the red region of insufficient intensity, may be obtained by transmitting light from light emitting element 14 through red filter layer 2. Therefore, red light of sufficient intensity may be obtained when the light, from light-emitting element 14, is converted to light in red region by means of at least a fluorescent dye or pigment.

The fluorescent dye or pigment that emits fluorescent light in the red region while absorbing light, emitted from light emitting element 14, in a blue to blue-green region, may be selected from a rhodamine dye, a cyanine dye or a pyridine dye, or an oxadine dye. Alternatively, direct dyes, acid dyes, basic dyes or disperse dyes may be used to the limited extent that each exhibits fluorescence.

Examples of rhodamine dyes include, rhodamine B, rhodamine 6G, rhodamine 3B, rhodamine 101, rhodamine 110, sulforhodamine, basic violet 11, and basic red 2.

Examples of cyanine dyes include, 4-dicyanomethylene-2-methyl-6-(p-dimethylaminostyryl)-4H-pyran (DCM).

Examples of pyridine dyes include, 1-ethyl-2-[4-(p-dimethylaminophenyl)-1,3-butadienyl]-pyridium-perchlorate (pyridine 1).

The fluorescent dye or pigment that emits fluorescent light in the green region while absorbing light, emitted from light emitting element 14, in a blue to blue-green region, may be selected from a coumarin dye, a dyestuff of coumarin dye species, ora naphthylimide dye. Alternatively, direct dyes, acid dyes, basic dyes or disperse dyes may be used to the limited extent that each exhibits fluorescence.

Examples of coumarin dyes include, 3-(2'-benzothiazolyl)-7-diethylaminocoumarin (coumarin 6), 3-(2'-benzoimidazolyl)-7-N,N-diethylaminocoumarin (coumarin 7), 3-(2'-N-methylbenzoimidazolyl)-7-N,N-diethylaminocoumarin (coumarin 30), and 2,3,5,6-1H,4H-tetrahydro-8-trifluoromethylquinolidine(9,9a,1-gh)coumarin (coumarin 153).

Examples of a dystuff of the coumarin dye species includes basic yellow 51.

Examples of naphthylimide dyes include, solvent yellow 11 and solvent yellow 116.

The fluorescent dyes or pigments listed above may be mixed by kneading with polymethacrylate resin, polyvinylchloride resin, vinylchloride-vinylacetate copolymer resin, alkyd resin, aromatic sulfonamide resin, urea resin, melamine resin, benzoguanamine resin, or mixture of these resins, to obtain a fluorescent pigment. Any of the fluorescent dyes or pigments may be used alone or in combinations of two or more species.

A matrix resin is a photo-setting or photo-and-thermo-setting resin bearing the fluorescent pigment. The photo-setting or photo-and-thermo-setting resin is polymerized or crosslinked by radical species or ion species, generated by optical or thermal treatment, and becomes insoluble and unmeltable in the usable environment.

The photo-setting or photo-and-thermo-setting resin may be one of the following specific materials.

(1) A material obtained by polymerization of photo-radicals or thermo-radicals, generated by optical or thermal treatment of film. The film comprising acrylic multifunctional monomers or oligomers including a multiple of acryloyl groups or methacryloyl groups and a photo- or thermo-polymerization initiator. This photo-setting or photo-and-thermo-setting resin allows particularly high precision patterning and is beneficial to reliability factors such as resistance to solvent and resistance to heat.

(2) A material, dimerized and crosslinked, obtained by optically or thermally treating a composition of polyvinylcinnamate and a sensitizer.

(3) A material obtained by crosslinking olefin and nitrene. The nitrene generated by optically or thermally treating film composed of direct chain olefins or cyclic olefins and bisazide.

(4) A material, polymerized by acid (cation) generation, obtained through optically or thermally treating a film composed of epoxy-group-containing monomers and a photo-acid-generating agent.

The photopolymerization initiator used in the invention is a photopolymerization initiator of a hydrogen abstraction type having a benzophenone skeleton represented by the general formula (I) or (II) within the molecule.

The specific examples of the general formula (I) include the compounds of (I-1) to (I-8) given below.

(I-1)
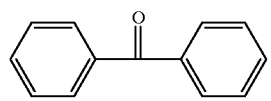

(I-2)
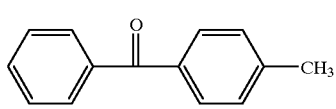

(I-3)
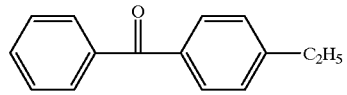

(I-4)
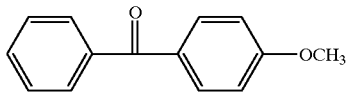

(I-5)
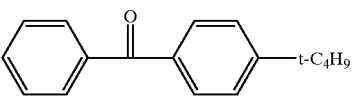

(I-6)
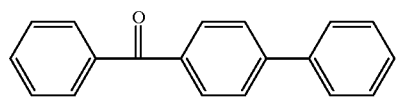

(I-7)
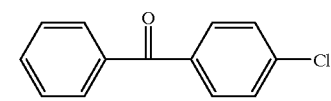

(I-8)
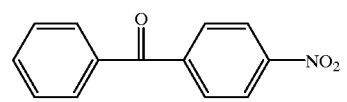

The specific examples of the general formula (II) include the compounds of (II-1) to (II-7) given below.

(II-1)
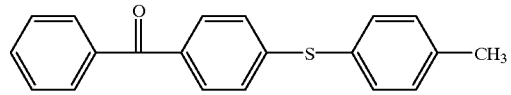

(II-2)
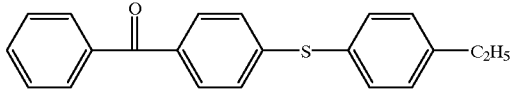

(II-3)
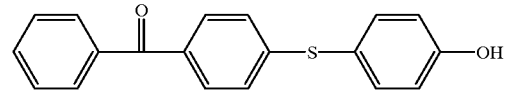

(II-4)
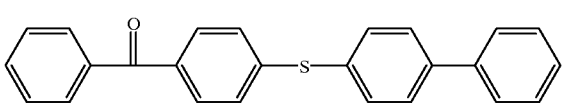

(II-5)
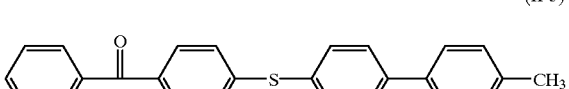

(II-6)
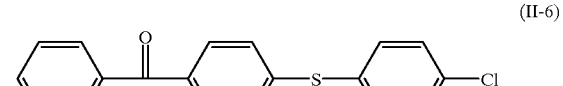

-continued

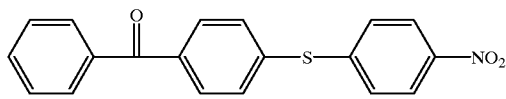

(II-7)

The photo-polymerization initiators, of a hydrogen abstraction type having a benzophenone skeleton (i.e. benzophenone compounds), are compounds that can be synthesized by general methods or obtained from suppliers.

A p-dimethylbenzoate compound may be additionally used to mitigate polymerization difficulties due to air inclusion in the hardening process.

As shown in FIG. 2, organic light-emitting element 14 comprises an anode 8, composed of transparent electrodes of ITO or other substitutable material. Anode 8 is patterned on insulative inorganic oxide film 7. Organic light-emitting element 14 further comprises, a hole injection layer 9 covering anode 8, a hole transport layer 10 formed on hole injection layer 9, an organic light-emitting layer 11 formed on hole transport layer 10, an electron injection layer 12 formed on organic light-emitting layer 11, and a cathode 13. Cathode 13 is composed of metal electrodes patterned on electron injection layer 12. The patterns of anode 8 and cathode 13 are formed in each set of stripes and the two sets of stripes are disposed orthogonal with each other.

When selected stripes of anode 8 and cathode 13 are electrically charged, organic light-emitting layer 11 emits light at positions where the charged stripes cross each other. Only the points in the light-emitting layer 11, where a specific filter layer disposes, can be lit by charging a selected set of anode 8 stripes and a selected set of cathode 13 stripes. Light from the selected points transmits through each of the filter layers, and each of the selected colors is output through transparent substrate 5.

For example, where points corresponding to fluorescent conversion filter layer 1 are lit, the light is converted into red light in fluorescent conversion filter layer 1, then passes through red filter layer 2 and transparent substrate 5, and outputs as red light.

For example, where points corresponding to green filter layer 3 are lit, the light, after transmission through green filter layer 3, changes to light including only a green component, passes through transparent substrate 5, and outputs as green light.

Similarly, where points corresponding to blue filter layer 4 are lit, the light, after transmission through blue filter layer 4, changes to light including only a blue component, passes through transparent substrate 5, and outputs as blue light.

Organic light-emitting element 14 has a structure where organic light-emitting layer 11 is sandwiched between anode 8 and cathode 13. As may be required, hole injection layer 9 and/or electron injection layer 12 is interposed between organic light-emitting layer 11 and anode 8 and cathode 13.

The following layer constructions may be applied:
(1) anode 8/organic light-emitting layer 11/cathode 13
(2) anode 8/hole injection layer 9/organic light-emitting layer 11/cathode 13
(3) anode 8/organic light-emitting layer 11/electron injection layer 12/cathode 13
(4) anode 8/hole injection layer 9/organic light-emitting layer 11/electron injection layer 12/cathode 13
(5) anode 8/hole injection layer 9/hole transport layer 10/organic light-emitting layer 11/electron injection layer 12/cathode 13

Material of each of the above layers may be selected from known substances. For the material of organic light-emitting layer 11 to emit blue to green light, a fluorescent brightening agent may be used. Favored examples include benzothiazole, benzimidazole or benzoxazole, a metal chelate oxynoid compound, a styrylbenzene compound, or an aromatic dimethylidyne compound.

The following are fabrication process examples and corresponding comparative examples, including the corresponding results, for the complete organic light emitting device as shown in FIG. 2.

EXAMPLE 1

The filter portion illustrated in FIG. 1, was fabricated by the process described below. Transparent substrate 5 of corning glass (143×112×1.1 mm) was prepared. To obtain red filter layer 2, a Color Filter red (available under the trade name Colormosaic CR-7001 from Fuji Film Olin Co., Ltd.) was coated by means of spin-coating on the substrate, followed by patterning by photolithography, to create a stripe pattern of 1 μm thickness, 0.33 mm width and 1.2 mm gap.

To obtain blue filter layer 4, a Color Filter blue (available under the trade name Colormosaic CB-7001 from Fuji Film Olin Co., Ltd.) was coated by means of spin-coating on the substrate, followed by patterning by photolithography to create a stripe pattern of 1 μm thickness, 0.33 mm width and 1.2 mm gap.

To obtain green filter layer 3, a Color Filter green (available under the trade name Colormosaic CG-7001 from Fuji Film Olin Co., Ltd.) was coated by means of spin-coating on transparent substrate 5, followed by patterning by photolithography, to create a stripe pattern of 1 μm thickness, 0.33 mm width and 1.2 mm gap.

The fluorescent conversion filter layer 1, illustrated in FIG. 1, was fabricated by the process described below. A solution for fluorescent conversion filter layer 1 was prepared by dissolving fluorescent dyes, including 0.6 parts by weight of coumarin 6, 0.3 parts by weight of rhodamine 6G and 0.3 parts by weight of basic violet 11; transparent photopolymerization resins including 60 parts by weight of Denacol DA-314 (a trade name) from Nagase Chemical Industries Co., Ltd., 30 parts by weight of Aronix M-215 (a trade name) from Toagosei Co., Ltd., and 15 parts by weight of Aronix M-5700 (a trade name) from Toagosei Co., Ltd.; and 5 parts by weight of a benzophenone compound of (I-4); in 120 parts by weight of propyleneglycolmonoethylacetate (PGMEA).

The resulting solution was coated on the surface of the respective color filter layers and transparent substrate 5 by means of spin-coating followed by baking in an oven to obtain a fluorescent conversion film. Polyvinylalcohol was coated on fluorescent conversion film by spin-coating and dried to form an oxygen isolating film. The Fluorescent conversion film on red filter layer2 was exposed through a mask using an exposure apparatus equipped with a light source of a high pressure mercury lamp to be patterned with stripes of 0.33 mm width and 1.2 mm gap, and developed with alkaline aqueous solution to form the stripe pattern. The resulting article was baked in an oven to obtain a fluorescent conversion filter of total thickness 7 μm including a red filter layer 2 of 1 μm thick and a fluorescent conversion filter layer 1 of 6 μm thick on the red filter layer.

A UV hardening type resin, which is epoxy modified acrylate, was coated on the above obtained filter layers by spin-coating, and exposed by a high pressure mercury lamp to form a protective layer 6 of 3 μm thick. Afterwards the pattern of the fluorescent conversion filter layer 1 was not distorted and the protective layer was flat. A heating test at 100° C. was conducted, and no distortion of fluorescent conversion filter layer 1 or protective layer 6 was observed.

The organic light-emitting device, illustrated in FIG. 1, was fabricated by the process described below. On the filter portion fabricated above, organic light-emitting element 14 was formed having a 6 layer structure of anode 8/hole injection layer 9/hole transport layer 10/organic light-emitting layer 11/electron injection layer 12/cathode 13.

First, a film for transparent electrodes (ITO) was formed on the whole surface of insulative inorganic oxide film 7, by a sputtering method. Then, photoresist (available under the trade name OFRP-800 from Tokyo Ohka Kogyo Co., Ltd.) was coated on the ITO, followed by patterning by means of photolithography to obtain anode 8 constituting a pattern of stripes having a width of 0.33 mm, a gap of 0.07 mm and a film thickness of 100 nm.

Second, the resulting substrate was installed in a resistance-heating evaporation chamber, and hole injection layer 9, hole transport layer 10, organic light-emitting layer 11 and electron injection layer 12 were successively deposited in the same chamber holding a vacuum.

Table 1 shows the substances and their structural formulas used in these organic layers. The pressure in the evaporation chamber during deposition process was $1\times10^{-4}$ Pa. Hole injection layer 9 was formed by depositing 100 nm of Cu phthalocyanine (CuPc). Hole transport layer 10 was formed by depositing 20 nm of 4,4'-bis[N-(1-naphthyl)-N-phenylamino]biphenyl (α-NPD). Organic light-emitting layer 11 was formed by depositing 30 nm of 4,4'-bis(2,2'-diphenylvinyl) biphenyl (DPVBi). Electron injection layer 12 was formed by depositing 20 nm of aluminum chelate (Alq).

TABLE 1

| Layer | Substance | Structural Formula |
|---|---|---|
| Hole Injection Layer 9 | Cu phthalocyanine | |
| Hole Transport Layer 10 | 4,4'-bis[N-(1-naphthyl)-N-phenylamino]biphenyl | |
| Organic Light-Emitting Layer 11 | 4,4'-bis(2,2-diphenylvinyl)biphenyl | |

TABLE 1-continued

| Layer | Substance | Structural Formula |
|---|---|---|
| Electron Injection Layer 12 | tris(8-hydroxyquinoline) aluminium complex | |

Third, the substrate with the laminate was removed from the evaporation chamber. Then a mask for patterning stripes of cathode 13 was attached and the substrate was again installed into the resistance-heating evaporation chamber to obtain cathode 13 having the pattern of stripes each having a width of 0.33 mm and a gap of 0.07 nm. Cathode 13 was formed of a Mg—Ag (weight ratio 10:1) layer having a thickness of 200 nm.

Fourth, the obtained organic light-emitting device was sealed with a sealing glass plate and UV-hardening adhesive under a dry nitrogen atmosphere in a glove box.

EXAMPLE 2

The filter portion of Example 2 was fabricated in the same manner as in Example 1 except that the photopolymerization initiator of the fluorescent conversion filter of Example 1 (5 parts by weight of a benzophenone compound of (I-4)) was replaced by 5 parts by weight of a benzophenone compound of (I-5). On the thus fabricated filter portion, an organic light-emitting element 14, similar to that of Example 1, was formed to obtain an organic light-emitting device of Example 2.

EXAMPLE 3

The filter portion of Example 3 was fabricated in the same manner as in Example 1 except that the photopolymerization initiator of the fluorescent conversion filter of Example 1 was replaced by 5 parts by weight of a benzophenone compound of (II-2). On the thus fabricated filter portion, organic light-emitting element 14, similar to that of Example 1, was formed to obtain an organic light-emitting device of Example 3.

EXAMPLE 4

The filter portion of Example 4 was fabricated in the same manner as in Example 1 except that the photopolymerization initiator of the fluorescent conversion filter of Example 1 was replaced by 5 parts by weight of a benzophenone compound of (II-4). On the thus fabricated filter portion, organic light-emitting element 14, similar to that of Example 1, was formed to obtain an organic light-emitting device of Example 4.

Comparative Example 1

The filter portion of Comparative Example 1 was fabricated in the same manner as in Example 1 except that the photopolymerization initiator of the fluorescent conversion filter of Example 1 was replaced by 5 parts by weight of a photo-cleavage type initiator of (III-1) given below. On the thus fabricated filter portion, an organic light-emitting element 14, similar to that of Example 1, was formed to obtain the organic light-emitting device of Comparative Example 1.

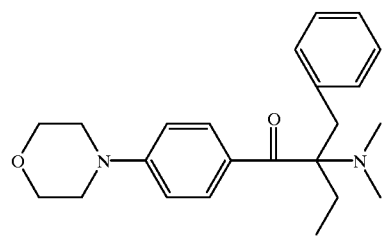

(III-1)

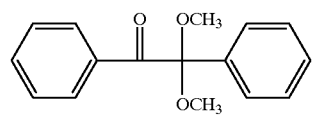

(III-2)

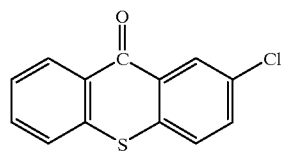

(III-3)

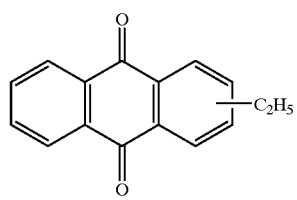

(III-4)

Comparative Example 2

The filter portion of Comparative Example 2 was fabricated in the same manner as in Example 1 except that the photopolymerization initiator of the fluorescent conversion filter of Example 1 was replaced by 5 parts by weight of the photo-cleavage type initiator of (III-2) given above. On the thus fabricated filter portion, an organic light-emitting element 14, similar to that of Example 1, was formed to obtain the organic light-emitting device of Comparative Example 2.

Comparative Example 3

The filter portion of Comparative Example 3 was fabricated in the same manner as in Example 1 except that the photopolymerization initiator of the fluorescent conversion filter of Example 1 was replaced by 5 parts by weight of a hydrogen abstraction type initiator of a thioxanthone compound represented by (III-3) above. On the thus fabricated filter portion, an organic light-emitting element 14, similar to that of Example 1, was formed to obtain the organic light-emitting device of Comparative Example 3.

Comparative Example 4

The filter portion of Comparative Example 4 was fabricated in the same manner as in Example 1 except that the photopolymerization initiator of the fluorescent conversion filter of Example 1 was replaced by 5 parts by weight of a hydrogen abstraction type initiator of a anthraquinone compound represented by (III-4) above. On the thus fabricated filter portion, an organic light-emitting element 14, similar to that of Example 1, was formed to obtain the organic light-emitting device of Comparative Example 4.

The results of evaluations on the organic light-emitting devices of Examples 1 through 4 and Comparative Examples 1 through 4 are summarized in Table 2. The CIE chromaticity coordinate was measured with "MCPD-1000" (trade name) manufactured by Ohtsuka Denshi Co., Ltd. Relative conversion efficiency is defined as brightness of a sample of an organic light-emitting device lit by applying a standard voltage relative to brightness of Example 1 lit by the standard voltage. Standard voltage is determined as the voltage that brings about brightness of 50 cd/m$^2$ with the organic light-emitting device of Example 1.

TABLE 2

| | CIE chromaticity coordinate | | Relative Conversion Efficiency |
|---|---|---|---|
| | X | Y | |
| Example 1 | 0.65 | 0.34 | 1.00 |
| Example 2 | 0.64 | 0.33 | 1.04 |
| Example 3 | 0.65 | 0.34 | 0.98 |
| Example 4 | 0.65 | 0.33 | 1.05 |
| Comparative Example 1 | 0.61 | 0.36 | 0.81 |
| Comparative Example 2 | 0.62 | 0.38 | 0.76 |
| Comparative Example 3 | 0.59 | 0.37 | 0.60 |
| Comparative Example 4 | 0.60 | 0.39 | 0.56 |

As shown in Table 2, red light emission with high color purity and high relative conversion efficiency were achieved in Examples 1 through 4 where the photopolymerization initiator used was a hydrogen abstraction type initiator of a benzophenone compound. In contrast, lower red color purity and degraded relative conversion efficiency resulted with Comparative Examples 1 through 4 where a photopolymerization initiator of a cleavage type or an initiator of quinone structure was used.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A fluorescent conversion filter comprising:
   at least one of an organic fluorescent dye and a pigment that absorb light in a near ultraviolet to visible light region;
   at least one of said organic fluorescent dye and said pigment emitting visible light of a different wavelength than the incoming light;
   a matrix resin bearing at least one of said organic fluorescent dye and said pigment and a photopolymerization initiator;
   said photopolymerization initiator represented by at least one of formula (I) or (II):

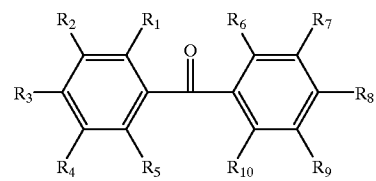

(I)

wherein each of $R_1$ through $R_{10}$ is independently selected from the group consisting of a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, and an optionally substituted pyridyl group,

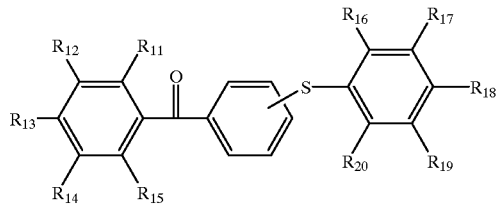

(II)

wherein each of $R_{11}$ through $R_{20}$ is independently selected from the group consisting of a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, and an optionally substituted pyridyl group.

2. A fluorescent conversion filter, according to claim 1, wherein:
   said matrix resin includes said organic fluorescent dye and said photopolymerization initiator.

3. A fluorescent conversion filter, according to claim 1, wherein:
   said matrix resin includes said pigment and said photopolymerization initiator.

4. A fluorescent conversion filter, according to claim 1, wherein:
   said matrix resin includes said organic fluorescent dye and said pigment and said photopolymerization initiator.

5. A fluorescent conversion filter, according to claim 1, wherein:
said fluorescent dye and said pigment are materials that favorably absorb light in the blue to blue-green region and emit a visible light in a wavelength different than the absorbed light.

6. A fluorescent conversion filter, according to claim 1, wherein:
said fluorescent dye and said pigment emit at least light in the red region.

7. A fluorescent conversion filter, according to claim 1, wherein:
said matrix resin also contains a photo-sensitizer; and
said photo-sensitizer acting to increase the rate of hardening.

8. A fluorescent conversion filter, according to claim 1, wherein:
said matrix resin is obtained by polymerization of at least one of a photo-radical and a thermo-radical, generated by at least one of an optical and a thermal treatment of a film;
said film containing at least one of an acrylic multifunctional monomer and an oligomer including a multiple of at least one of a acryloyl group and a methacryloyl group; and
said film containing at least one of a photo-polymerization initiator and a thermo-polymerization initiator.

9. A fluorescent conversion filter, according to claim 1, wherein:
said matrix resin is a dimerized and cross linked material; and
said matrix resin is obtained by at least one of an optical and a thermal treatment of a composition of polyvinylcinnamate and a sensitizer.

10. A fluorescent conversion filter, according to claim 1, wherein:
said matrix resin is created by crosslinking an olefin and a nitrene;
said matrix resin generated by at least one of an optical and a thermal treating of film; and
said film composed of at least one of a direct chain olefin and a cylic olefins and a bisazide.

11. A fluorescent conversion filter, according to claim 1, wherein:
said matrix resin is at least one of a photo-setting resin material and a photo-and-thermo setting resin material polymerized by acid generation;
said matrix resin is generated by at least one of an optical and a thermal treatment of a film; and
said film is composed of epoxy-group-containing monomers and a photo-acid-generating agent.

12. An organic light-emitting device comprising:
a fluorescent conversion filter and an organic light emitting element;
said fluorescent conversion filter containing at least one of an organic fluorescent dye and a pigment that absorb light in a near ultraviolet to visible light region;
said organic fluorescent dye and said pigment emitting visible light of a different wavelength than the incoming light;
a matrix resin bearing at least one of said organic fluorescent dye and said pigment and a photopolymerization initiator; and
said photopolymerization initiator represented by at least one of formula (I) or (II):

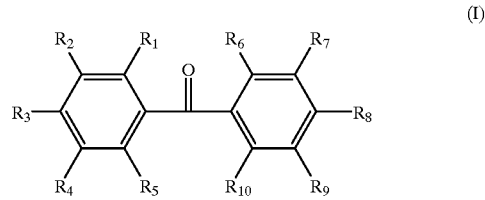

wherein each of $R_1$ through $R_{10}$ is independently selected from the group consisting of a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, and an optionally substituted pyridyl group,

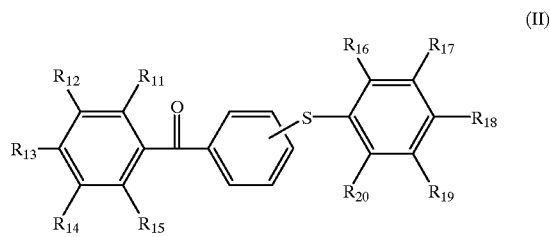

wherein each of $R_{11}$ through $R_{20}$ is independently selected from the group consisting of a hydrogen atom, a carboxyl group, a hydroxyl group, a nitro group, a halogen atom, an alkyl group of 1 to 6 carbon atoms, an alkoxyl group of 1 to 6 carbon atoms, an aralkyl group of 7 to 18 carbon atoms, an optionally substituted aryl group of 6 to 18 carbon atoms, an optionally substituted aromatic heterocyclic group, an optionally substituted cyclohexyl group, an optionally substituted aryloxyl group, and an optionally substituted pyridyl group.

13. An organic light-emitting device according to claim 12, further comprising:
an anode patterned on an insulative inorganic oxide film in said fluorescent conversion filter; and
said anode pattern composed of a set of stripes.

14. An organic light-emitting device according to claim 13, further comprising:
a cathode formed on an electron injection layer;
said cathode composed of metal electrodes patterned on said electron injection layer in a set of stripes; and
said anode stripes disposed orthogonal to said cathode stripes.

15. An organic light-emitting device according to claim 13, further comprising:
a hole injection layer covering said anode;
a hole transport layer formed on said hole injection layer;
an organic light emitting layer formed on said hole transport layer; and
an electron injection layer formed on said organic light emitting layer.

* * * * *